United States Patent
Hojabri et al.

[11] Patent Number: 6,166,579
[45] Date of Patent: Dec. 26, 2000

[54] DIGITALLY CONTROLLED SIGNAL MAGNITUDE CONTROL CIRCUIT

[75] Inventors: Peyman Hojabri, San Jose; Andrew Morrish, Saratoga, both of Calif.

[73] Assignee: National Semiconductor Corporation, Santa Clara, Calif.

[21] Appl. No.: 09/348,533

[22] Filed: Jul. 7, 1999

Related U.S. Application Data

[63] Continuation-in-part of application No. 09/322,681, May 28, 1999.

[51] Int. Cl.[7] .................................................. H03L 5/00
[52] U.S. Cl. ....................... 327/308; 327/309; 327/310; 327/318; 327/324; 327/379
[58] Field of Search ................................ 327/308, 309, 327/310, 318, 324, 379

[56] References Cited

U.S. PATENT DOCUMENTS

| | | | |
|---|---|---|---|
| 3,748,495 | 7/1973 | Messinger | 327/308 |
| 3,810,035 | 5/1974 | Gundry | 327/308 |
| 3,812,478 | 5/1974 | Tomisawa et al. | 327/355 |
| 4,375,082 | 2/1983 | Lohrmann | 327/334 |
| 4,646,036 | 2/1987 | Brown | 327/308 |
| 5,497,403 | 3/1996 | Harada et al. | 327/312 |
| 5,635,852 | 6/1997 | Wallace | 326/30 |
| 5,757,220 | 5/1998 | Murden et al. | 327/308 |
| 5,877,599 | 3/1999 | Hojabri | 315/371 |
| 6,040,692 | 3/2000 | Manlove et al. | 327/308 |

*Primary Examiner*—Kenneth B. Wells
*Assistant Examiner*—Long Nguyen
*Attorney, Agent, or Firm*—Baker & McKenzie

[57] ABSTRACT

A digitally controlled signal attenuator circuit which allows an incoming DC-clamped signal to be selectively attenuated using a set of digital control signals while maintaining its DC clamping. Multiple stages of such a circuit can be cascaded to provide for multiple forms of signal attenuation without affecting the clamping. Preferred forms of the attenuator circuit use pass transistors and transmission gates as switches for selectively altering the resistance values of resistive circuits connected in shunt to and in series with the signal being attenuated. In the case of where the subject signal is a variable DC signal such a brightness control voltage, such circuit configurations also allow the output signal voltage range to include values which are more negative than the DC clamp voltage as well as more positive.

37 Claims, 6 Drawing Sheets

DIGITALLY CONTROLLED SIGNAL MAGNITUDE CONTROL CIRCUIT

This is a continuation-in-part of application Ser. No. 09/322,681, filed May 28, 1999.

BACKGROUND OF THE INVENTION

1. Field of the Invention

The present invention relates to signal attenuation circuit architectures, and in particular, signal attenuator circuits that are controlled by digital signals.

2. Description of the Related Art

Many high speed analog signal systems require some form of high speed signal magnitude control, such as a variable attenuator circuit. Perhaps one of the more common techniques for providing this function is the use of analog multiplier circuits. However, such circuits are generally not very accurate and do not interface well with the digital control systems that have become more prevalent.

Accordingly, it would be desirable to have some form of digitally controlled signal magnitude control circuit architecture that provides accurate signal attenuation characteristics and interfaces more directly with a digital control system.

SUMMARY OF THE INVENTION

In accordance with the present invention, a high speed digitally controlled signal magnitude control circuit architecture is provided in which a digital control signal controls solid state switches for configuring a resistor ladder architecture to achieve desired signal attenuation values. The subject architecture can be duplicated and cascaded to provide an Nth-order digitally controlled signal magnitude control circuit, and is particularly advantageous for use in multimedia applications in which high speed audio and video signals are processed.

In accordance with one embodiment of the present invention, a digitally controlled signal magnitude control circuit includes a reference DC signal source circuit, a composite signal source circuit and a signal magnitude control circuit. The reference DC signal source circuit is configured to provide a reference DC signal. The composite signal source circuit is configured to provide a first composite signal with a first AC component and a first DC component which is substantially equal to the reference DC signal. The signal magnitude control circuit has a programmable signal magnitude transfer function, is coupled to the reference DC signal source circuit and the composite signal source circuit, and is configured to receive a plurality of digital control signals, the reference DC signal and the first composite signal and in accordance therewith provide a second composite signal with a second AC component which corresponds to the first AC component and a second DC component which is substantially equal to the reference DC signal. Respective values of the plurality of digital control signals define corresponding values of the programmable signal magnitude transfer function and a ratio of the second AC component and the first AC component is substantially equal to one of the values of the programmable signal magnitude transfer function.

In accordance with another embodiment of the present invention, a digitally controlled signal magnitude control circuit includes a reference DC signal source circuit, a variable DC signal source circuit and a signal magnitude control circuit. The reference DC signal source circuit is configured to provide a reference DC signal. The variable DC signal source circuit is configured to provide a variable DC signal with a first range of magnitudes defined by lower and upper first range limits. The signal magnitude control circuit has a programmable signal magnitude transfer function, is coupled to the reference DC signal source circuit and the variable DC signal source circuit, and is configured to receive a plurality of digital control signals, the reference DC signal and the variable DC signal and in accordance therewith provide a composite DC signal with a variable DC component which corresponds to the variable DC signal and a reference DC component which is substantially equal to the reference DC signal. Respective values of the plurality of digital control signals define corresponding values of the programmable signal magnitude transfer function. The variable DC component includes a second range of magnitudes defined by lower and upper second range limits. The lower and upper second range limits are more negative and more positive than the reference DC component, respectively. A ratio of the second range of variable DC component magnitudes and the first range of variable DC signal magnitudes corresponds to one of the values of the programmable signal magnitude transfer function.

In accordance with still another embodiment of the present invention, a digitally controlled signal attenuator circuit includes a reference terminal, an input terminal, an output terminal, resistive circuits and a resistive switching circuit. The reference terminal is configured to convey a reference DC signal. The input terminal is configured to convey an input signal with an input AC component and an input DC component. The input DC component is substantially equal to the reference DC signal. The output terminal is configured to convey an output signal with an output AC component and an output DC component. The output DC component is substantially equal to the reference DC signal and a ratio of the input AC component and the output AC component is substantially equal to one of a plurality of programmable signal attenuation values. One resistive circuit is coupled between the input terminal and the reference terminal and has a resistive circuit resistance. Another resistive circuit is coupled between the input terminal and the output terminal. The resistive switching circuit is coupled between the input terminal, the output terminal, the reference terminal the first resistive circuit, has a resistive switching circuit resistance and is configured to receive a plurality of digital control signals and in accordance therewith establish effective values of resistance for the resistive circuit resistance and the resistive switching circuit resistance. Respective ones of the effective resistance values define corresponding ones of the plurality of programmable signal attenuation values.

In accordance with yet another embodiment of the present invention, a digitally controlled signal attenuator circuit includes a reference terminal, an input terminal, an output terminal, resistive circuits and a resistive switching circuit. The reference terminal is configured to convey a reference DC signal. The input terminal is configured to convey a variable DC input signal with an input range of magnitudes defined by lower and upper input range limits. The output terminal is configured to convey a composite DC output signal with a variable DC component which corresponds to the variable DC input signal and a reference DC component which is substantially equal to the reference DC signal. The variable DC component includes an output range of magnitudes defined by lower and upper output range limits. The lower and upper output range limits are more negative and more positive than the reference DC component, respectively. A ratio of the input range of variable DC input signal magnitudes and the output range of variable DC component magnitudes corresponds to one of a plurality of programmable signal attenuation values. One resistive circuit is coupled between the input terminal and the reference terminal and has a resistive circuit resistance. Another resistive circuit is coupled between the input terminal and the output terminal. The resistive switching circuit is coupled between the input terminal, the output terminal, the reference terminal and the first resistive circuit, has a resistive switching circuit resistance and is configured to receive a plurality of digital control signals and in accordance therewith establish effective values of resistance for the resistive circuit resistance and the resistive switching circuit resistance. Respective ones of the effective resistance values define corresponding ones of the plurality of programmable signal attenuation values.

These and other features and advantages of the present invention will be understood upon consideration of the following detailed description of the invention and the accompanying drawings.

DETAILED DESCRIPTION OF THE INVENTION

Figure 1:
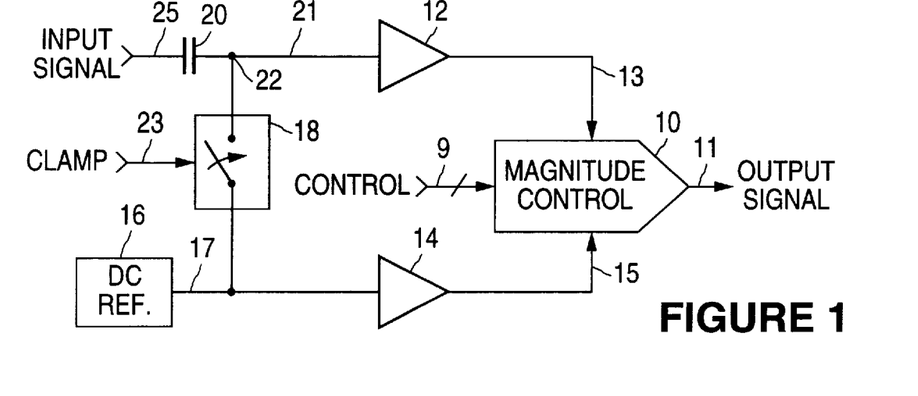
FIG. 1 is a functional block diagram of an analog signal system using a digitally controlled signal magnitude control circuit in accordance with one embodiment of the present invention.

Referring to FIG. 1, an analog signal system using a digitally controlled signal magnitude control circuit in accordance with one embodiment of the present invention includes a magnitude control circuit 10, buffer amplifiers 12, 14, a DC reference voltage source 16, a synchronous switching circuit 18 and a series coupling capacitor 20. The input signal 25, which typically includes both AC and DC signal components, is AC-coupled to node 22 where it is summed with the DC reference voltage 17, via the switch circuit 18, during the DC clamping intervals as defined by the clamp signal 23 (e.g., such as during the horizontal blanking interval in the case of a video input signal). This DC-clamped signal 21 is buffered by the buffer amplifier 12. The DC reference voltage 17 is also buffered by a buffer amplifier 14.

These buffered composite (i.e., AC and DC) 13 and DC 15 signals are provided to the magnitude control circuit 10. In accordance with a digital control signal 9, the output signal 11 is another composite signal. This signal 11 includes a DC component equal to the buffered DC reference voltage 15 (as well as the buffered DC component of the input composite signal 13). This signal 11 further includes an AC component which is equal to the buffered AC component of the input composite signal 13 multiplied by the transfer function of the stage 10 as determined by the digital control signal 9. (For example, if the digital control signal 9 defines an attenuation of 5 decibels, the AC component in the output signal 11 is 5 decibels less than the AC component of the input signal 13.)

Figure 2:
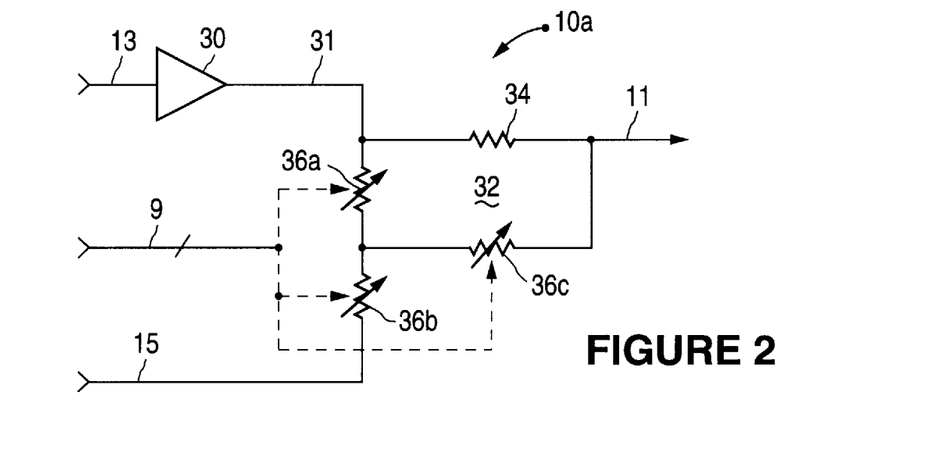
FIG. 2 is a circuit schematic diagram representing the operation of the digitally controlled signal magnitude control circuit of FIG. 1.

Referring to FIG. 2, the magnitude control circuit 10 of FIG. 1 can be represented by the embodiment 10a which includes an input buffer amplifier 30 and a digitally controlled resistive attenuator circuit 32. The DC reference voltage 15 is applied at the bottom, while the buffered composite signal 31 is applied at the top. In accordance with the digital control signal 9, variable resistances 36a, 36b, 36c are adjusted, thereby producing, in conjunction with a series resistance 34, a resistive attenuation factor. (Specific and more detailed embodiments of this resistive circuit 32 are discussed in more detail below.)

Figure 3:
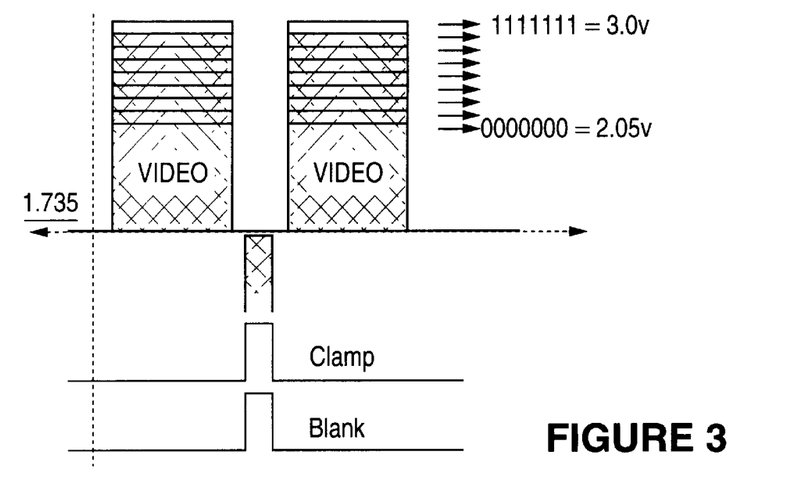
FIG. 3 is a signal diagram representing the signal magnitude control provided by the circuit of FIG. 1.

Referring to FIG. 3, operation of the circuit of FIG. 1 when used to process a clamped video signal can be better understood. During the horizontal blanking interval, the DC reference voltage 17 (FIG. 1) clamps the AC-coupled input signal. During the active video or OSD (on screen display) portions of the input signal 25, the digital control signal 9 determines the attenuation of the buffered composite signal 13 to establish the level of the output signal 11. In this example, for a 7-bit control signal 9, the output signal 11 can be adjusted over the range of 2.05 volts (maximum attenuation) through 3.0 volts (minimum attenuation).

Figure 4:
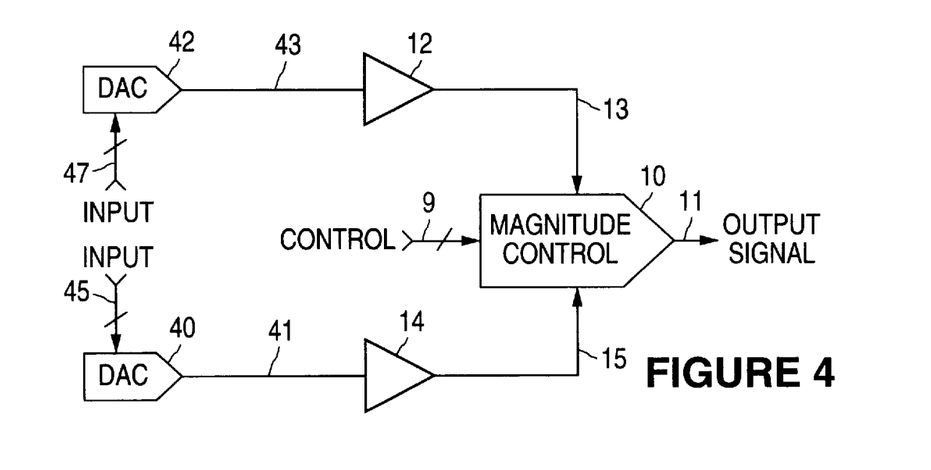
FIG. 4 is a functional block diagram of an analog signal system using a digitally controlled signal magnitude control circuit in accordance with another embodiment of the present invention.

Referring to FIG. 4, in accordance with another embodiment of the present invention, the magnitude control circuit 10 can be used to process, in accordance with the reference voltage 15, a variable DC voltage signal 13. In the case of a video signal system, for example, this voltage 13 can be the brightness control for the display monitor. A digital input signal 47 is varied in value in accordance with the desired brightness setting. This signal 47 drives a digital-to-analog converter circuit (DAC) 42, thereby producing a variable analog voltage signal 43 which is buffered by the buffer amplifier 12 to drive the top of the magnitude control circuit 10. Similarly, the DC reference source can be implemented using another DAC 40, thereby allowing the DC reference voltage 15 to also be established in accordance with a digital control signal 45.

Figure 5:
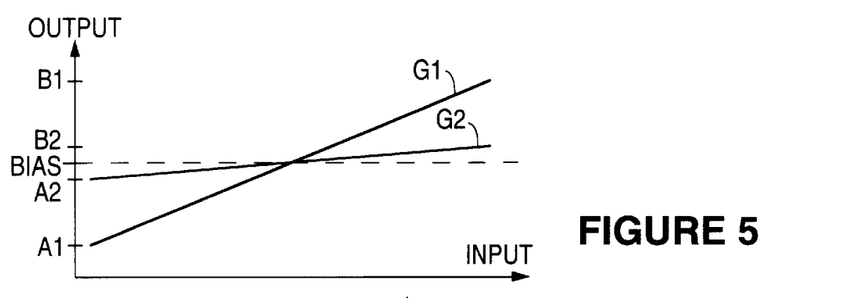
FIG. 5 is a graph representing the operation of the digitally controlled signal magnitude control circuit of FIG. 4 when used to control the attenuation profile of a variable DC signal.

Referring to FIG. 5 the effect of the digital control signal 9 upon the resulting variable DC output signal 11 from the circuit of FIG. 4 can be better understood. For a minimum attenuation (or maximum gain) as defined by the digital control signal 9, the output signal 11 will vary between values A1 and B1 with a slope G1 as shown. Conversely, for a maximum attenuation (or minimum gain), the output signal 11 will vary over a range of A2 through B2 with a slope of G2 as shown. These ranges can be shifted up (more positive) or down (more negative) in accordance with the bias voltage BIAS which is established by the DC reference voltage 15. These ranges of values of the variable DC output signal 11, as compared to the corresponding ranges of values of the input variable DC voltage signal 13, are determined by the attenuation factor established by the digital control signal 9.

Figure 6:
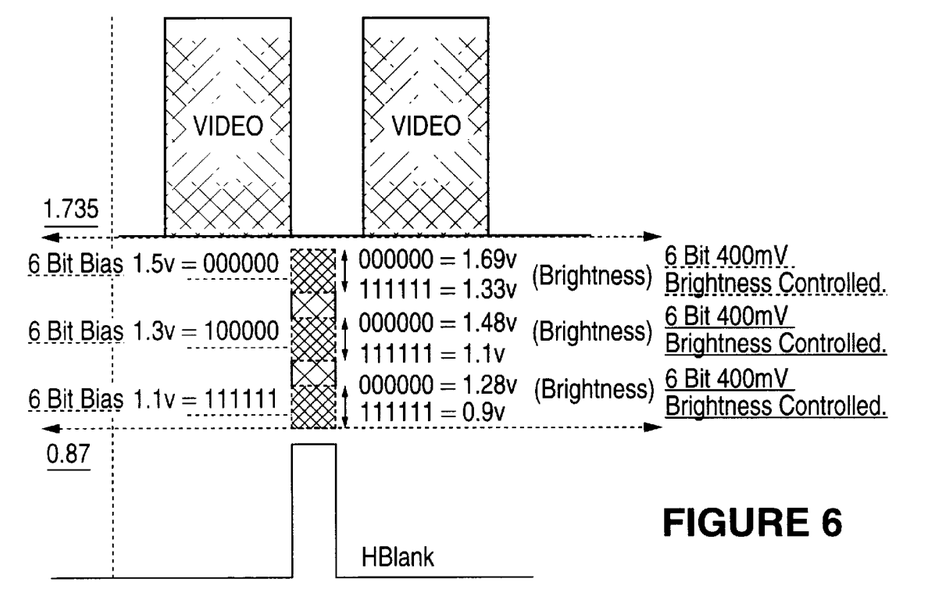
FIG. 6 is a signal diagram representing the signal magnitude control provided by the circuit of FIG. 4.

Referring to FIG. 6, operation of the circuit of FIG. 4 in a video signal system can be better understood. During the horizontal blanking interval, the brightness control range, as defined by the digital control signal 9, can be varied as shown. This control range, as noted above, can be shifted by varying the DC reference voltage in more positive or more negative directions. For example, for a DC reference, or bias, voltage of 1.3 volts (as established by the control signal 45 to the DC reference voltage source DAC 40) and a 400 millivolt brightness control voltage (as established by the brightness control signal 47), the digital magnitude control signal 9 can vary the brightness control output signal 11 over a range of 1.1 volts (maximum attenuation) through 1.48 volts (minimum attenuation).

Figures 7, 7A:
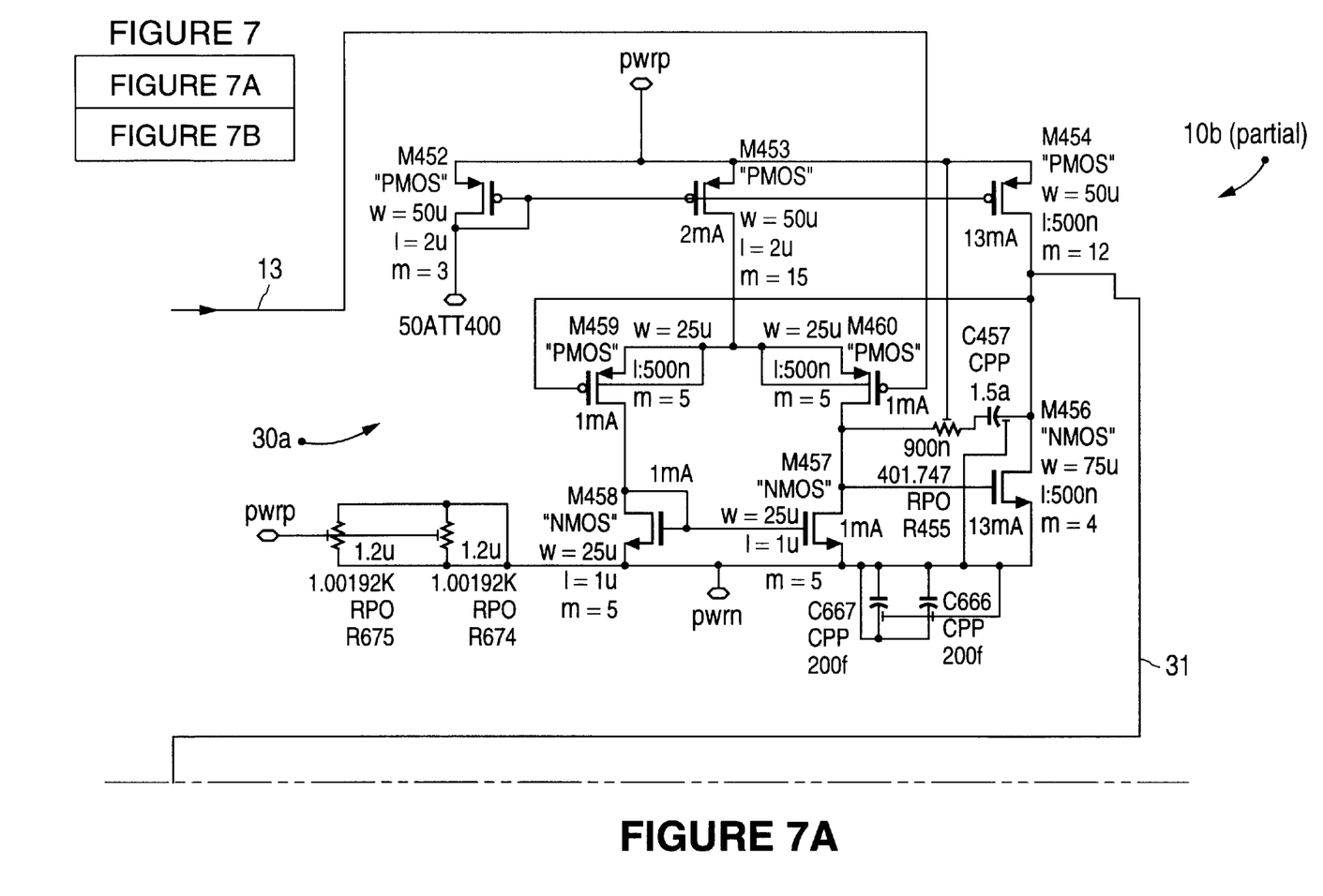
FIG. 7 is a circuit schematic diagram of an example embodiment of the digitally controlled signal magnitude control circuits of FIGS. 1 and 4.
Figure 7B:
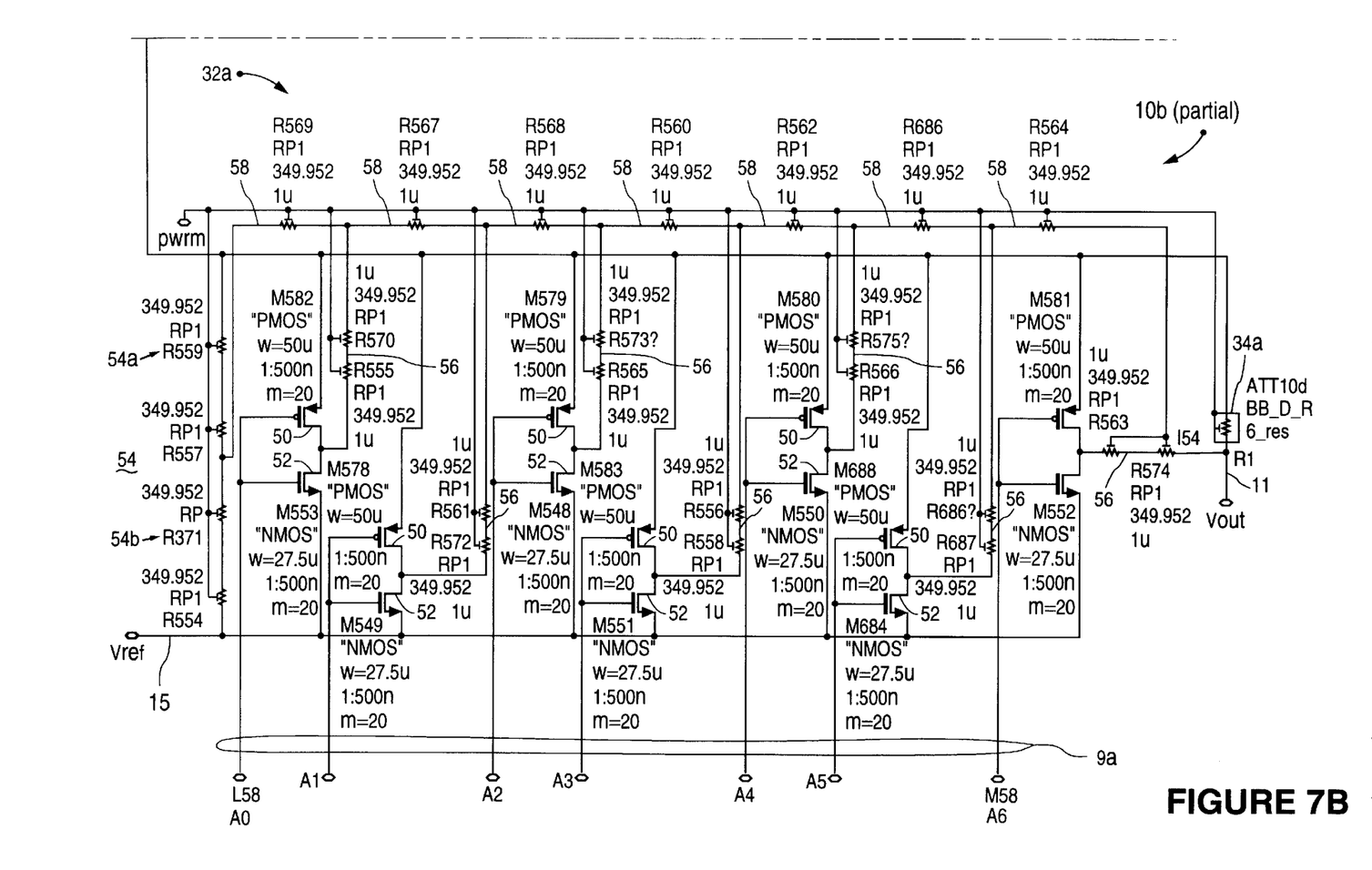

Referring to FIG. 7, one embodiment 10b of the magnitude control circuit 10 (FIGS. 1 and 4) can be implemented as shown. The input buffer amplifier 30 is implemented as a complementary MOSFET amplifier 30a. As discussed above (in connection with FIG. 2), the buffered signal 31 drives the top of the resistive array 32a, while the DC reference voltage 15 drives the bottom. Series-connected pass transistors in the form of P-type MOSFETs 50 and N-type MOSFETs 52 and a set of series resistances 54 are connected between the nodes driven by the signal 31 and reference voltage 15. (In this example, due to the integrated circuit structure being used, the various resistors 54, 56, 58 are implemented using MOSFET devices with fixed bias potentials (PWRP or PWRN, as appropriate) applied to their respective gate 15 terminals.)

In accordance with the binary states of the bits A0–A6 (in this case 7 bits) of the digital control signal 9a, the pass transistors 50, 52 cause the bottom ends of resistor circuits 56 to be driven by either the buffered signal 31 or the reference voltage 15. This has the effect of connecting various permutations of series resistors 58 and shunt resistors 56 across either the upper portion 54a or lower portion 54b of the shunt resistive circuit 54 on the input side. The resulting net resistance interacts with the series fixed resistance 34a to produce the desired attenuation factor. This selective connecting of the various resistances in this manner produces the variable resistances 36a, 36b, 36c depicted in the circuit diagram of FIG. 2.

Figures 8, 8A:
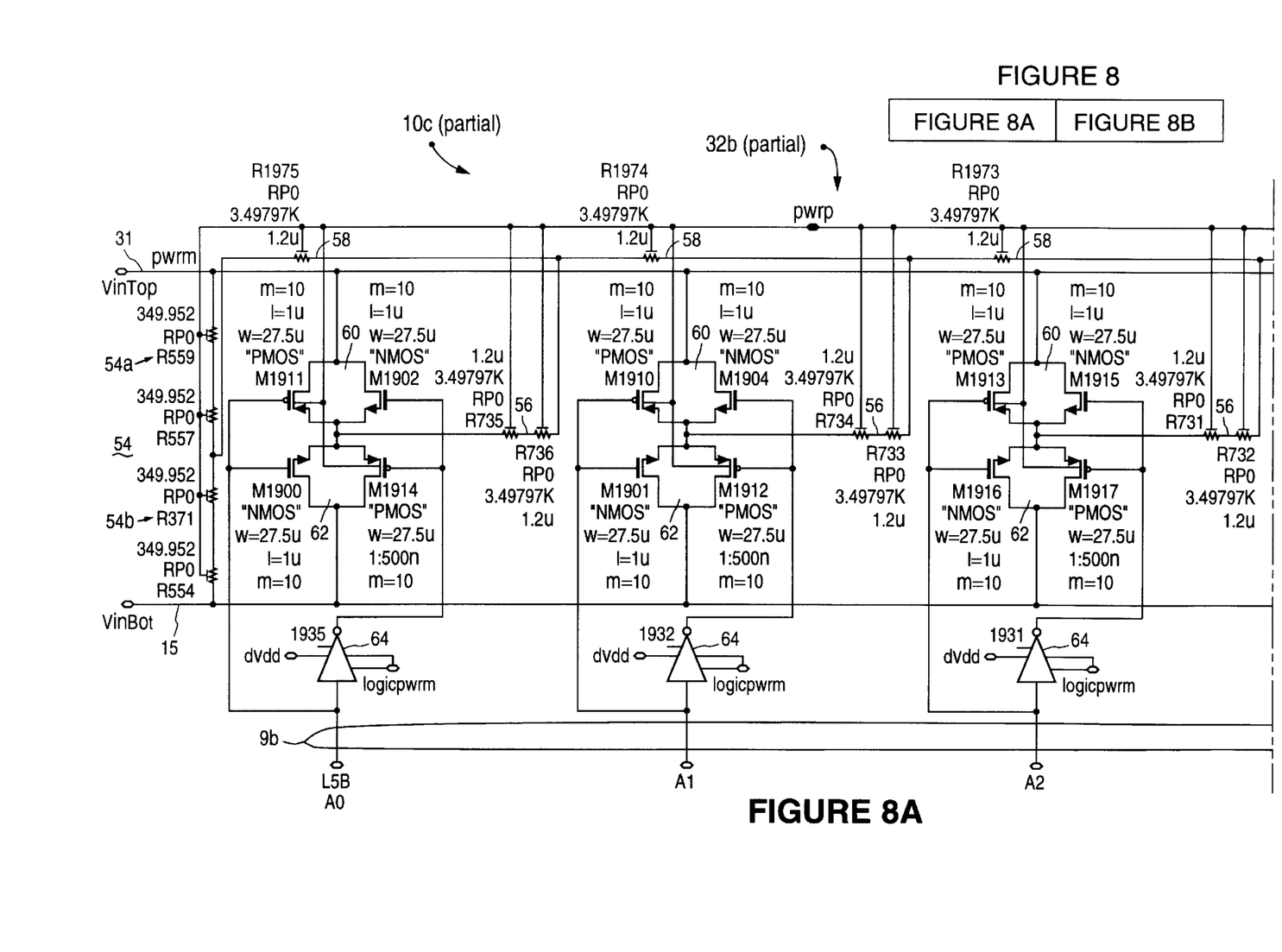
FIG. 8 is a circuit schematic diagram of another example embodiment of the digitally controlled signal magnitude control circuits of FIGS. 1 and 4.
Figure 8B:
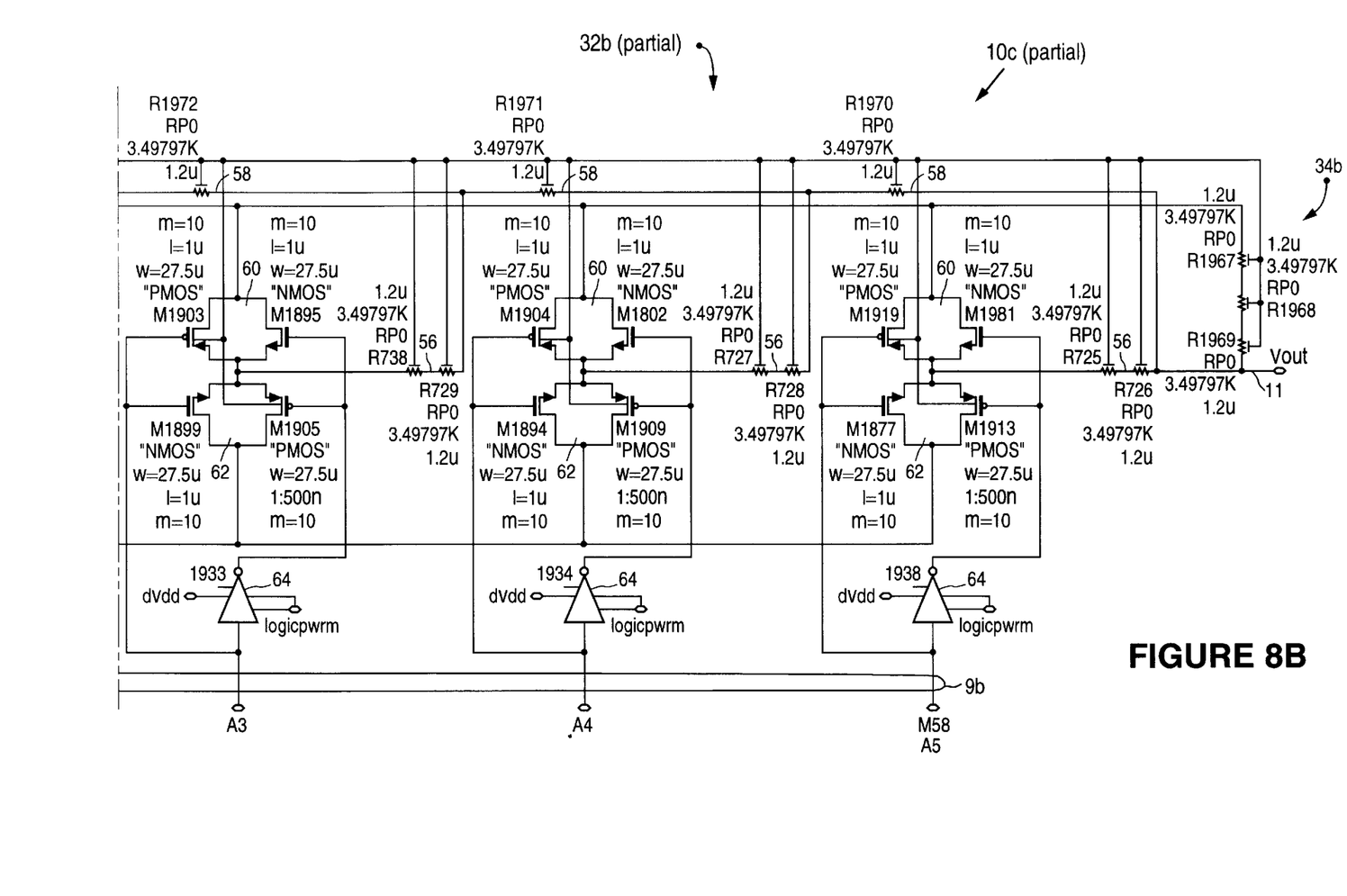

Referring to FIG. 8, another embodiment 10c of the magnitude control circuit 10 uses the same basic technique of switching resistances to produce the variable resistive network depicted in FIG. 2, but uses transmission gate circuits 60, 62 in place of the pass transistors 50, 52. Accordingly, the individual bits A0–A5 (in this case 6 bits) of the digital control signal 9b are also inverted using inverter circuits 64 for driving the transmission gate circuits 60, 62. This circuit 32b operates in an manner similar to that of the circuit 32a of FIG. 7. However, the transmission gate circuits 60, 62 provide improved isolation for when the incoming signal 31 is a variable DC voltage which may, at times, be more negative than the DC reference voltage 15. This allows the nodes driven by the signal 31 and reference voltage 15 to "flip" in polarity with respect to each other as needed. In other words, as shown in the graph of FIG. 5, the output signal 11 may sometimes be more negative than the DC reference voltage 15 providing the bias potential. Using transmission gate circuits 60, 62 allows this to be done more reliably.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a digitally controlled signal magnitude control circuit, comprising:

a reference DC signal source circuit configured to provide a reference DC signal;

a composite signal source circuit configured to provide a first composite signal with a first AC component and a first DC component which is substantially equal to said reference DC signal; and a signal magnitude control circuit with a programmable signal magnitude transfer function, coupled to said reference DC signal source circuit and said composite signal source circuit, configured to receive a plurality of digital control signals, said reference DC signal and said first composite signal and in accordance therewith provide a second composite signal with a second AC component which corresponds to said first AC component and a second DC component which is substantially equal to said reference DC signal, wherein respective values of said plurality of digital control signals define corresponding values of said programmable signal magnitude transfer function and a ratio of said second AC component and said first AC component is substantially equal to one of said values of said programmable signal magnitude transfer function.

2. The apparatus of claim 1, wherein said reference DC signal source circuit comprises a unity gain buffer amplifier circuit.

3. The apparatus of claim 1, wherein said composite signal source circuit comprises a unity gain buffer amplifier circuit.

4. The apparatus of claim 1, wherein said composite signal source circuit comprises a signal combining circuit configured to receive a combining control signal and in accordance therewith receive and combine a DC reference signal with an AC signal and in accordance therewith provide said first composite signal, wherein said DC reference signal corresponds to said reference DC signal.

5. The apparatus of claim 4, wherein said signal combining circuit comprises:

a voltage clamp circuit configured to receive said combining control signal and in accordance therewith receive and combine said DC reference signal with said AC signal and in accordance therewith provide a clamped AC signal; and a buffer amplifier circuit, coupled to said voltage clamp circuit, configured to receive and buffer said clamped AC signal and in accordance therewith provide said first composite signal.

6. The apparatus of claim 1, wherein said signal magnitude control circuit omprises:

an input amplifier circuit configured to receive said first composite signal and in accordance therewith provide a third composite signal with a third AC component which corresponds to said second AC component and a third DC component which is substantially equal to said reference DC signal; and a programmable signal attenuation circuit, coupled to said input amplifier circuit, configured to receive said plurality of digital control signals and said reference DC signal and in accordance therewith selectively attenuate said third composite signal and in accordance therewith provide said second composite signal, wherein a ratio of said second AC component and said third AC component corresponds to said one of said values of said programmable signal magnitude transfer function.

7. The apparatus of claim 6, wherein said programmable signal attenuation circuit comprises a digitally controlled resistive attenuator circuit with a plurality of resistive circuits having respective values of resistance which are controlled with said plurality of digital control signals.

8. The apparatus of claim 7, wherein said digitally controlled resistive attenuator circuit comprises a plurality of serially coupled pass transistor circuits coupled between said input amplifier circuit and said reference DC signal source circuit.

9. An apparatus including a digitally controlled signal magnitude control circuit, comprising:
   reference DC signal source means for providing a reference DC signal;
   composite signal source means for providing a first composite signal with a first AC component and a first DC component which is substantially equal to said reference DC signal; and
   signal magnitude control means with a programmable signal magnitude transfer function, coupled to said reference DC signal source means and said composite signal source means, for receiving a plurality of digital control signals, said reference DC signal and said first composite signal and in accordance therewith providing a second composite signal with a second AC component which corresponds to said first AC component and a second DC component which is substantially equal to said reference DC signal, wherein respective values of said plurality of digital control signals define corresponding values of said programmable signal magnitude transfer function and a ratio of said second AC component and said first AC component is substantially equal to one of said values of said programmable signal magnitude transfer function.

10. The apparatus of claim 9, wherein said signal magnitude control means comprises digitally controlled resistive attenuator means.

11. An apparatus including a digitally controlled signal magnitude control circuit, comprising:
   a reference DC signal source circuit configured to provide a reference DC signal;
   a variable DC signal source circuit configured to provide a variable DC signal with a first range of magnitudes defined by lower and upper first range limits; and
   a signal magnitude control circuit with a programmable signal magnitude transfer function, coupled to said reference DC signal source circuit and said variable DC signal source circuit, configured to receive a plurality of digital control signals, said reference DC signal and said variable DC signal and in accordance therewith provide a composite DC signal with a variable DC component which corresponds to said variable DC signal and a reference DC component which is substantially equal to said reference DC signal, wherein respective values of said plurality of digital control signals define corresponding values of said programmable signal magnitude transfer function,
   said variable DC component includes a second range of magnitudes defined by lower and upper second range limits,
   said lower and upper second range limits are more negative and more positive than said reference DC component, respectively, and
   a ratio of said second range of variable DC component magnitudes and said first range of variable DC signal magnitudes corresponds to one of said values of said programmable signal magnitude transfer function.

12. The apparatus of claim 11, wherein said reference DC signal source circuit comprises a unity gain buffer amplifier circuit.

13. The apparatus of claim 11, wherein said reference DC signal source circuit comprises a digital-to-analog signal conversion circuit configured to receive another plurality of digital control signals and in accordance therewith provide a corresponding analog DC signal as said reference DC signal.

14. The apparatus of claim 11, wherein said variable DC signal source circuit comprises a unity gain buffer amplifier circuit.

15. The apparatus of claim 11, wherein said variable DC signal source circuit comprises a digital-to-analog signal conversion circuit configured to receive a plurality of digital signals and in accordance therewith provide a corresponding analog DC signal as said variable DC signal, wherein said plurality of digital signals has a range of values which define said first range of magnitudes and said lower and upper first range limits for said variable DC signal.

16. The apparatus of claim 11, wherein said signal magnitude control circuit comprises a digitally controlled resistive attenuator circuit with a plurality of resistive circuits having respective values of resistance which are controlled with said plurality of digital control signals.

17. The apparatus of claim 16, wherein said digitally controlled resistive attenuator circuit comprises a plurality of serially coupled transmission gate circuits coupled between said reference DC signal source circuit and said variable DC signal source circuit.

18. An apparatus including a digitally controlled signal magnitude control circuit, comprising:
   reference DC signal source means for providing a reference DC signal;
   variable DC signal source means for providing a variable DC signal with a first range of magnitudes defined by lower and upper first range limits; and
   signal magnitude control means with a programmable signal magnitude transfer function, coupled to said reference DC signal source means and said variable DC signal source means, for receiving a plurality of digital control signals, said reference DC signal and said variable DC signal and in accordance therewith providing a composite DC signal with a variable DC component which corresponds to said variable DC signal and a reference DC component which is substantially equal to said reference DC signal, wherein respective values of said plurality of digital control signals define corresponding values of said programmable signal magnitude transfer function,
   said variable DC component includes a second range of magnitudes defined by lower and upper second range limits,
   said lower and upper second range limits are more negative and more positive than said reference DC component, respectively, and
   a ratio of said second range of variable DC component magnitudes and said first range of variable DC signal magnitudes corresponds to one of said values of said programmable signal magnitude transfer function.

19. The apparatus of claim 18, wherein said signal magnitude control means comprises digitally controlled resistive attenuator means.

20. An apparatus including a digitally controlled signal attenuator circuit, comprising:
- a reference terminal configured to convey a reference DC signal;
- an input terminal configured to convey an input signal with an input AC component and an input DC component, wherein said input DC component is substantially equal to said reference DC signal;
- an output terminal configured to convey an output signal with an output AC component and an output DC component, wherein said output DC component is substantially equal to said reference DC signal and a ratio of said input AC component and said output AC component is substantially equal to one of a plurality of programmable signal attenuation values;
- a first resistive circuit, coupled between said input terminal and said reference terminal and having a first resistive circuit resistance;
- a second resistive circuit, coupled between said input terminal and said output terminal; and
- a resistive switching circuit, coupled between said input terminal, said output terminal, said reference terminal said first resistive circuit and having a resistive switching circuit resistance, configured to receive a plurality of digital control signals and in accordance therewith establish effective values of resistance for said first resistive circuit resistance and said resistive switching circuit resistance, wherein respective ones of said effective resistance values define corresponding ones of said plurality of programmable signal attenuation values.

21. The apparatus of claim 20, wherein said first resistive circuit comprises a resistor coupled to said input terminal and said reference terminal.

22. The apparatus of claim 20, wherein said second resistive circuit comprises:
- an intermediate terminal;
- a third resistive circuit, coupled between said input terminal and said intermediate terminal; and
- a fourth resistive circuit, coupled between said intermediate terminal and said reference terminal.

23. The apparatus of claim 22, wherein:
- said third resistive circuit comprises one or more resistors coupled to said input terminal and said intermediate terminal; and
- said fourth resistive circuit comprises another one or more resistors coupled to said intermediate terminal and said reference terminal.

24. The apparatus of claim 20, wherein said resistive switching circuit comprises:
- a plurality of switching terminals;
- a third resistive circuit, coupled between said output terminal, said first resistive circuit and said plurality of switching terminals and having a third resistive circuit resistance;
- a first plurality of switch circuits, coupled between said input terminal and said plurality of switching terminals, configured to receive a plurality of digital control signals and in accordance therewith switchably couple said input terminal and respective ones of said plurality of switching terminals; and
- a second plurality of switch circuits, coupled between said reference terminal and said plurality of switching terminals, configured to receive said plurality of digital control signals and in accordance therewith switchably couple said reference terminal and respective ones of said plurality of switching terminals.

25. The apparatus of claim 24, wherein:
- said third resistive circuit comprises a plurality of resistors coupled to said output terminal, said first resistive circuit and said plurality of switching terminals;
- said first plurality of switch circuits comprises a first plurality of pass transistor circuits coupled to said input terminal and said plurality of switching terminals; and
- said second plurality of switch circuits comprises a second plurality of pass transistor circuits coupled to said reference terminal and said plurality of switching terminals.

26. The apparatus of claim 24, wherein said third resistive circuit comprises:
- a resistive ladder circuit with a plurality of branching terminals, coupled between said output terminal and said first resistive circuit; and
- a plurality of resistive branching circuits, coupled between said plurality of branching terminals and said plurality of switching terminals.

27. An apparatus including a digitally controlled signal attenuator circuit, comprising:
- reference means for conveying a reference DC signal;
- input means for conveying an input signal with an input AC component and an input DC component, wherein said input DC component is substantially equal to said reference DC signal;
- output means for conveying an output signal with an output AC component and an output DC component, wherein said output DC component is substantially equal to said reference DC signal and a ratio of said input AC component and said output AC component is substantially equal to one of a plurality of programmable signal attenuation values;
- first resistive means, coupled between said input means and said reference means and having a first resistive means resistance;
- second resistive means, coupled between said input means and said output means; and
- resistive switching means, coupled between said input means, said output means, said reference means said first resistive means and having a resistive switching means resistance, for receiving a plurality of digital control signals and in accordance therewith establishing effective values of resistance for said first resistive means resistance and said resistive switching means resistance, wherein respective ones of said effective resistance values define corresponding ones of said plurality of programmable signal attenuation values.

28. The apparatus of claim 27, wherein said resistive switching means comprises:
- a plurality of switching terminal means;
- third resistive means, coupled between said output means, said first resistive means and said plurality of switching terminal means and having a third resistive means resistance;
- a first plurality of switch means, coupled between said input means and said plurality of switching terminal means, for receiving a plurality of digital control signals and in accordance therewith switchably coupling said input means and respective ones of said plurality of switching terminal means; and a second plurality of switch means, coupled between said reference means and said plurality of switching terminal means, for receiving said plurality of digital control signals and in accordance therewith switchably coupling said reference means and respective ones of said plurality of switching terminal means.

29. An apparatus including a digitally controlled signal attenuator circuit, comprising:

a reference terminal configured to convey a reference DC signal;

an input terminal configured to convey a variable DC input signal with an input range of magnitudes defined by lower and upper input range limits;

an output terminal configured to convey a composite DC output signal with a variable DC component which corresponds to said variable DC input signal and a reference DC component which is substantially equal to said reference DC signal, wherein
   said variable DC component includes an output range of magnitudes defined by lower and upper output range limits,
   said lower and upper output range limits are more negative and more positive than said reference DC component, respectively, and
   a ratio of said input range of variable DC input signal magnitudes and said output range of variable DC component magnitudes corresponds to one of a plurality of programmable signal attenuation values;

a first resistive circuit, coupled between said input terminal and said reference terminal and having a first resistive circuit resistance;

a second resistive circuit, coupled between said input terminal and said output terminal; and a resistive switching circuit, coupled between said input terminal, said output terminal, said reference terminal and said first resistive circuit and having a resistive switching circuit resistance, configured to receive a plurality of digital control signals and in accordance therewith establish effective values of resistance for said first resistive circuit resistance and said resistive switching circuit resistance, wherein respective ones of said effective resistance values define corresponding ones of said plurality of programmable signal attenuation values.

30. The apparatus of claim 29, wherein said first resistive circuit comprises a resistor coupled to said input terminal and said reference terminal.

31. The apparatus of claim 29, wherein said second resistive circuit comprises:

an intermediate terminal;

a third resistive circuit, coupled between said input terminal and said intermediate terminal; and a fourth resistive circuit, coupled between said intermediate terminal and said reference terminal.

32. The apparatus of claim 31, wherein:

said third resistive circuit comprises one or more resistors coupled to said input terminal and said intermediate terminal; and said fourth resistive circuit comprises another one or more resistors coupled to said intermediate terminal and said reference terminal.

33. The apparatus of claim 29, wherein said resistive switching circuit comprises:

a plurality of switching terminals;

a third resistive circuit, coupled between said output terminal, said first resistive circuit and said plurality of switching terminals and having a third resistive circuit resistance;

a first plurality of switch circuits, coupled between said input terminal and said plurality of switching terminals, configured to receive a plurality of digital control signals and in accordance therewith switchably couple said input terminal and respective ones of said plurality of switching terminals; and a second plurality of switch circuits, coupled between said reference terminal and said plurality of switching terminals, configured to receive said plurality of digital control signals and in accordance therewith switchably couple said reference terminal and respective ones of said plurality of switching terminals.

34. The apparatus of claim 33, wherein:

said third resistive circuit comprises a plurality of resistors coupled to said output terminal, said first resistive circuit and said plurality of switching terminals;

said first plurality of switch circuits comprises a first plurality of transmission gate circuits coupled to said input terminal and said plurality of switching terminals; and said second plurality of switch circuits comprises a second plurality of transmission gate circuits coupled to said reference terminal and said plurality of switching terminals.

35. The apparatus of claim 33, wherein said third resistive circuit comprises:

a resistive ladder circuit with a plurality of branching terminals, coupled between said output terminal and said first resistive circuit; and a plurality of resistive branching circuits, coupled between said plurality of branching terminals and said plurality of switching terminals.

36. An apparatus including a digitally controlled signal attenuator circuit, comprising:

reference means for conveying a reference DC signal;

input means for conveying a variable DC input signal with an input range of magnitudes defined by lower and upper input range limits;

output means configured to convey a composite DC output signal with a variable DC component which corresponds to said variable DC input signal and a reference DC component which is substantially equal to said reference DC signal, wherein
   said variable DC component includes an output range of magnitudes defined by lower and upper output range limits,
   said lower and upper output range limits are more negative and more positive than said reference DC component, respectively, and
   a ratio of said input range of variable DC input signal magnitudes and said output range of variable DC component magnitudes corresponds to one of a plurality of programmable signal attenuation values;

first resistive means, coupled between said input means and said reference means and having a first resistive means resistance;

second resistive means, coupled between said input means and said output means; and resistive switching means, coupled between said input means, said output means, said reference means and said first resistive means and having a resistive switching means resistance, configured to receive a plurality of digital control signals and in accordance therewith establish effective values of resistance for said first resistive means resistance and said resistive switching means resistance, wherein respective ones of said effective resistance values define corresponding ones of said plurality of programmable signal attenuation values.

37. The apparatus of claim 36, wherein said resistive switching means comprises:

a plurality of switching terminal means;

third resistive means, coupled between said output means, said first resistive means and said plurality of switching terminal means and having a third resistive means resistance;

a first plurality of switch means, coupled between said input means and said plurality of switching terminal means, configured to receive a plurality of digital control signals and in accordance therewith switchably couple said input means and respective ones of said plurality of switching terminal means; and a second plurality of switch means, coupled between said reference means and said plurality of switching terminal means, configured to receive said plurality of digital control signals and in accordance therewith switchably couple said reference means and respective ones of said plurality of switching terminal means.

* * * * *

UNITED STATES PATENT AND TRADEMARK OFFICE
CERTIFICATE OF CORRECTION

PATENT NO : 6,166,579

DATED : December 26, 2000

INVENTOR(S) : Peyman Hojabri et al.

It is certified that error appears in the above-identified patent and that said Letters Patent are hereby corrected as shown below:

In Col. 6, line 58, delete "omprises:" and replace with --comprises:--.

Signed and Sealed this

Twenty-ninth Day of May, 2001

*Attest:*

NICHOLAS P. GODICI

*Attesting Officer*     *Acting Director of the United States Patent and Trademark Office*